(12) United States Patent
Zang et al.

(10) Patent No.: US 11,574,947 B2
(45) Date of Patent: Feb. 7, 2023

(54) METHOD AND IMAGE SENSOR WITH VERTICAL TRANSFER GATE AND BURIED BACKSIDE-ILLUMINATED PHOTODIODES

(71) Applicant: OmniVision Technologies, Inc., Santa Clara, CA (US)

(72) Inventors: Hui Zang, San Jose, CA (US); Gang Chen, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 165 days.

(21) Appl. No.: 16/996,804

(22) Filed: Aug. 18, 2020

(65) Prior Publication Data

US 2022/0059587 A1 Feb. 24, 2022

(51) Int. Cl.
*H01L 27/146* (2006.01)

(52) U.S. Cl.
CPC .. *H01L 27/14641* (2013.01); *H01L 27/14603* (2013.01); *H01L 27/14612* (2013.01); *H01L 27/14636* (2013.01); *H01L 27/14643* (2013.01)

(58) Field of Classification Search
None
See application file for complete search history.

(56) References Cited

U.S. PATENT DOCUMENTS

| 2016/0086984 A1* | 3/2016 | Wang | H01L 27/14689 257/292 |
| 2016/0218138 A1* | 7/2016 | Oishi | H01L 27/14607 |
| 2016/0219236 A1* | 7/2016 | Maeda | H01L 27/14612 |
| 2018/0061875 A1* | 3/2018 | Roy | H01L 27/14689 |
| 2019/0103428 A1* | 4/2019 | Wei | H01L 27/14621 |
| 2019/0237496 A1* | 8/2019 | Kwag | H04N 5/37457 |
| 2021/0074758 A1* | 3/2021 | Takahashi | H04N 5/374 |

FOREIGN PATENT DOCUMENTS

WO WO-2013065569 A1 * 5/2013 ....... H01L 27/14623

* cited by examiner

*Primary Examiner* — Scott B Geyer
(74) *Attorney, Agent, or Firm* — Lathrop GPM LLP

(57) ABSTRACT

A photodiode array has buried photodiodes and vertical selection transistors. Trenches are lined with gate oxide and metallic plugs of first material lie within the trenches. Gate contacts of second material contact the metallic plugs, with photodiode diffusion regions adjacent the trenches as sources of vertical transistors, the metallic plugs form gates of the vertical transistors, and buried photodiode regions form sources of the vertical transistors. In embodiments, the first conductive material is tungsten, titanium nitride, titanium carbide, or aluminum and the second conductive material is polysilicon. The array is formed by trenching, growing gate oxide, and depositing first material in the trenches. The first material is etched to define metallic plugs, the second material is deposited onto the metallic plugs then masked and etched; and drain regions implanted. Etching the second material is performed by a reactive ion etch that stops upon reaching the metallic plugs.

15 Claims, 6 Drawing Sheets

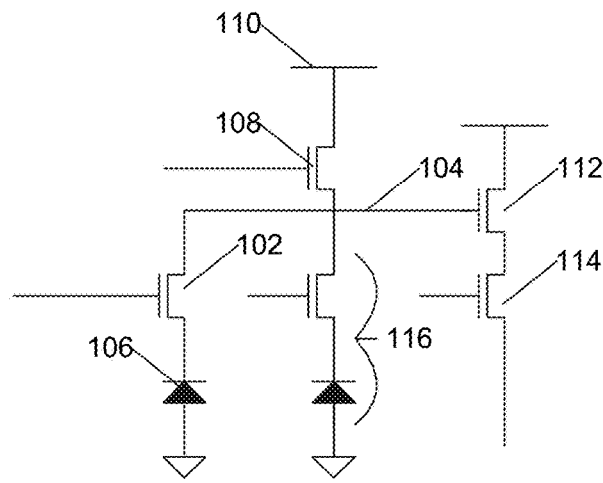
FIG. 1
PRIOR ART
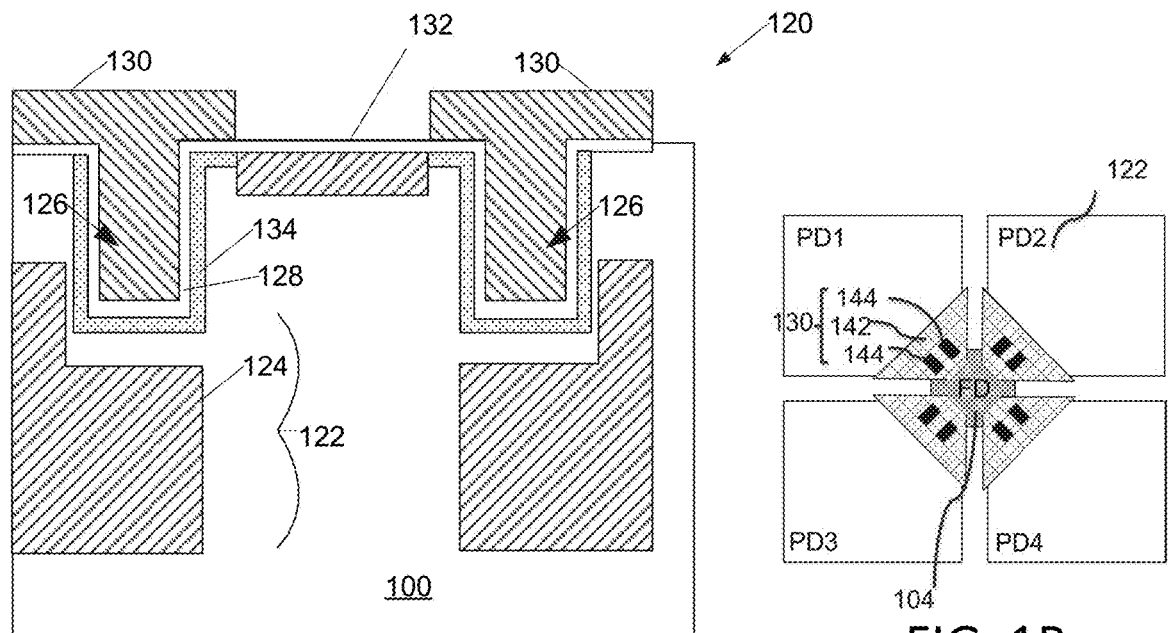
FIG. 1A
PRIOR ART
FIG. 1B
PRIOR ART

METHOD AND IMAGE SENSOR WITH VERTICAL TRANSFER GATE AND BURIED BACKSIDE-ILLUMINATED PHOTODIODES

BACKGROUND

Image sensing photodiode arrays are common in CMOS electronic cameras; most such photodiode arrays have photodiodes in or near the same plane as transfer-gate, sensing, and resetting transistors.

Typically, image sensing photodiode arrays are organized as illustrated in FIG. 1. The transfer transistors 102 selectively couple a sense and reset node 104, often known as a floating diffusion region and acting as a drain of the transfer transistors, to the photodiode 106 itself acting as a source of the transfer transistors, while the reset transistors 108 selectively couple the sense and reset node (also referred to as the floating diffusion region) 104 to a reset voltage 110 that may be a power supply voltage. The sensing transistors 112 are controlled by voltage of the sense and reset node 104 and provide a signal to a selection transistor 114 that is dependent on integrated photocurrent in photodiode 106 since a prior reset. There are often additional pairs 116 of photodiodes with transfer transistors coupled to each sense and reset node 104.

In a baseline embodiment 120, FIG. 1A, which provides a top view of a four-shared pixel structure resembling the photodiode structure of FIG. 1, photodiodes 122 are buried photodiodes with photodiode diffused regions 124 that do not reach surface of the silicon substrate 100 into which they are implanted. Trenches 126 are etched into the silicon substrate 100 to reach the photodiode diffused regions 124; these trenches are lined with a gate oxide 128 and filled with polysilicon material forming transfer gate 130, polysilicon material filling in trenches forms vertical gate electrodes for respective transfer gates 130 and couple respective photodiode diffused region 124 to a diffused region 132 serving as a drain of the associated transfer gate and as the floating diffusion region, the polysilicon material is also formed over the silicon surface to connect to a photodiode select line (not shown) through a contact. When the transfer gate 130 is driven to a voltage through that selects the photodiode, a channel 134 forms along both side walls of the vertical gate electrodes 126 and along the surface to diffusion region 132. As illustrated in FIG. 1, the drains of the transfer gates may be merged into a common diffusion region 132 as part of the floating diffusion region 104.

In an embodiment, the device illustrated in FIG. 1A is fabricated with the drain regions or floating diffusion region coupled to four transfer gates is formed in the center surrounding by photodiode diffusion regions 124 as illustrated in FIG. 1B. Each of the transfer gates has a gate formed of a planar polysilicon gate electrode 142 and two vertical transfer gate electrodes 144 extending from the planar polysilicon gate electrode 142 into the silicon substrate 100. The gate of each transfer gates 130 couples an associated photodiode (not shown in FIG. 1B but lying beneath the respective transfer gate 130) to a common floating diffusion region.

SUMMARY

In an embodiment, a pixel cell includes multiple photodiodes disposed in a semiconductor substrate; a floating diffusion region disposed in a semiconductor substrate; and multiple vertical transfer gates each coupling a photodiode of the photodiodes to the floating diffusion region. Each transfer gate includes a trench extended from a first surface of semiconductor substrate into the semiconductor substrate above the photodiode coupled to the respective transfer gate, the trench laterally extended from the photodiode into the floating diffusion region; and a vertical gate electrode disposed in the trench serving as the vertical gate of the respective transfer gate, the vertical transfer gate laterally extended into the floating diffusion region.

In another embodiment, a photodiode array has buried photodiodes and transfer transistors including a plurality of buried photodiode diffused regions forming buried photodiodes; a plurality of trenches formed over the buried photodiode diffused regions; gate oxide lining sidewalls of the trenches; metallic plugs formed of a first conductive material within the trenches adjacent the gate oxide; gate contacts formed of a second conductive material, the second conductive material different from the first conductive material, the gate contacts in contact with the metallic plugs; and floating diffusion region disposed adjacent the trenches of the transfer gate transistors; where the floating diffusion region forms a drain of transfer transistors, the metallic plugs form a vertical portion of gates of the transfer transistors, and buried photodiode diffused regions form a source of the transfer transistors.

In another embodiment, a method of manufacture of a photodiode array having buried photodiodes and vertical selection transistors coupled to buried photodiodes includes forming buried photodiode diffused regions in a silicon wafer; etching deep trenches from a surface of the silicon wafer to near the photodiode diffused regions; forming a gate oxide on sidewalls of the deep trenches; depositing a conductive metallic layer into the deep trenches; etching the conductive metallic layer to define conductive metallic plugs in deep portions of the deep trenches; depositing a conductive gate-contact material into and above the deep trenches forming conductive gate contacts contacting the respective metallic plugs in the deep trenches; masking and etching the conductive gate-contact material forming gates of vertical selection transistors; and implanting drain diffusion regions. The conductive metallic plugs form vertical gates of vertical selection transistors surrounded by the drain diffusion regions, each vertical selection transistor having a drain formed in the drain diffusion regions and a source formed of the respective photodiode diffused regions.

In another embodiment, a photodiode array has buried photodiodes and vertical selection transistors includes a plurality of buried photodiode diffused regions; a plurality of trenches formed in an epitaxial layer over the buried photodiode diffused regions; gate oxide lining sidewalls of the trenches; conductive gate material disposed within the trenches such that the gate material is wider at a base of each trench than at a top of each trench; implanting diffusion regions forming floating diffusion regions surrounding each deep trench of the deep trenches; wherein the conductive metallic plugs form vertical gates of vertical selection transistors, each vertical selection transistor having a drain formed of in the selected implanted drain diffusion region coupled thereto and a source formed of the respective photodiode diffused region of photodiode diffused regions.

In another embodiment, a method of manufacture of forming an array photosensor comprising a photodiode array with buried photodiodes includes forming buried photodiode diffused regions in a silicon wafer; etching deep trenches from a surface of the silicon wafer to near the photodiode diffused regions; growing a gate oxide on sidewalls of the deep trench; depositing a first conductive material into the deep trenches—in particular embodiments the first conductive material is a metal; etching the first conductive material to remove the first conductive material from atop the wafer but leaving plugs of the first conductive material in the deep trenches; depositing a second conductive material atop the plugs of the first conductive material—in embodiments the second conductive material is polysilicon; masking and etching the second conductive material using a reactive ion etch to narrow conductive material at tops of the trenches, while the reactive ion etch stops at the first conductive material at bottoms of the deep trenches, such that the second conductive material in the trenches is narrower at the top than the first conductive material is at the bottom of the deep trenches; and implanting drain diffusion regions surrounding respective deep trenches; wherein the first and second conductive material in the trenches forms gates of vertical selection transistors, each vertical selection transistor having a drain formed of the implanted drain diffusion region coupled thereto and a source of the respective photodiode diffused region of photodiode diffused regions.

BRIEF DESCRIPTION OF THE FIGURES

FIG. 1 is a schematic diagram of a portion of a typical photosensor array, illustrating components of current and prior art photosensor array.

FIG. 1A is a cross sectional diagram illustrating a PRIOR ART photodiode and vertical transfer transistor of a baseline photosensor array.

FIG. 1B is an exemplary layout of the PRIOR ART baseline array showing a shared-pixel cell of four photodiodes with vertical transfer transistors and a shared floating diffusion region.

DETAILED DESCRIPTION OF THE EMBODIMENTS

Figure 2:
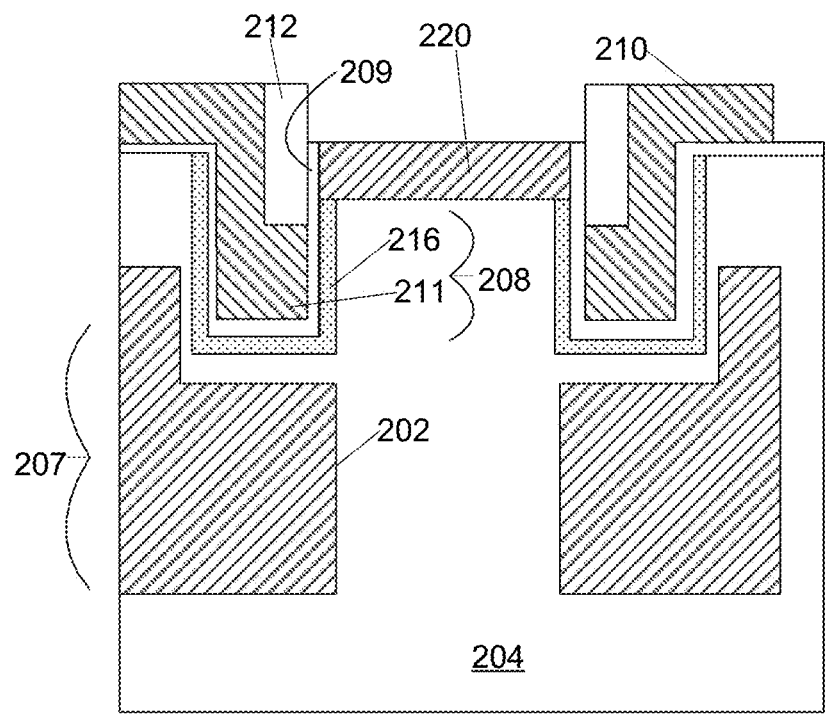
FIG. 2 is a cross-sectional diagram illustrating RIE photodiodes and vertical transfer transistors of a photosensor array fabricated according to an RIE embodiment of a method, additional structures including metal interconnect and isolation wells are omitted for clarity.

In a reactive-ion etch (RIE) embodiment, deeply buried photodiodes 207, formed of a buried photodiode diffusion region 202 (FIG. 2) of a first conductive type in a semiconductor substrate 204 of a second conductive type opposite to the first conductive type. The buried diffusions herein refer to diffusion regions formed in the semiconductor at a distance below the surface of semiconductor substrate 204, not reaching the surface of semiconductor substrate 204 and away from silicon surface to reduce dark currents. A common drain 220 of transfer gates 208, also known as a floating diffusion region 220, is at the silicon surface. In some embodiments, sensing (not shown), and reset 206 transistors are formed as a second layer over parts of respective photodiode diffusion regions 202 of an image sensor; allowing arrayed photodiodes to cover a higher percentage of the image sensor's surface and thereby increase sensitivity to low light levels.

In a process embodiment illustrated in FIG. 2, a transfer gate 208 with vertical gate electrodes is formed by, in approximate order although there are minor intervening steps:

1. Forming photodiodes 207 by creating a photodiode diffusion region 202 of a first conductive type (e.g., n-type) through masked diffusion or ion implantation into a semiconductor substrate 204 (e.g., silicon bulk substrate, doped silicon substrate, or a silicon-on-insulator (SOI) wafer) or a well of a second conductive type (e.g., p-type) opposite to the first conductive type that has been formed in the semiconductor substrate 204.

Optionally, an implant isolation well of the second conductive type is implanted by ion implantation into the semiconductor substrate 204 between adjacent photodiodes 207 providing isolation between photodiodes 207.

2. Etching a deep trench from the surface (e.g., front surface) of the semiconductor substrate 204 a trench depth (e.g., 350 nm~600 nm) into the semiconductor substrate 204 to near the photodiode diffusion region 202 of the respective photodiode 207. The trench depth of deep trench extends further into the semiconductor substrate 204 than the implant depth of photodiode diffusion region 202 of photodiode 207. This deep trench differs from the baseline embodiment in that it laterally extends all the way from the photodiode diffusion region 202 to, and with a portion formed into, a later-diffused drain region or floating diffusion region 220 of the transfer gate 208 being formed, thus eliminating need for the surface portion of the channel of the baseline embodiment. In an alternative embodiment, the deep trench is surrounded by the respective floating diffusion region 220 on at least three sides.

3. Growing a gate oxide 209 in the deep trench lining the inner surfaces of the deep trench. In some embodiments, gate oxide 209 further is extended onto a first surface (e.g., front surface) of the semiconductor substrate 204. In some embodiments, gate oxide 209 may be formed through deposition process, for example chemical vapor deposition. In some embodiments, gate oxide 209 may be formed by a thermal oxidation process. The thickness of gate oxide 209 may range between 30 Å to 100 ∈.

4. Depositing a polysilicon gate material 210 into and above the deep trench, the polysilicon gate material 210 filling the deep trench and forming polysilicon gate electrode 211 having a planar transfer gate electrode connecting portion and at least one vertical transfer gate electrode portion for each respective transfer gate 208.

Figure 3:
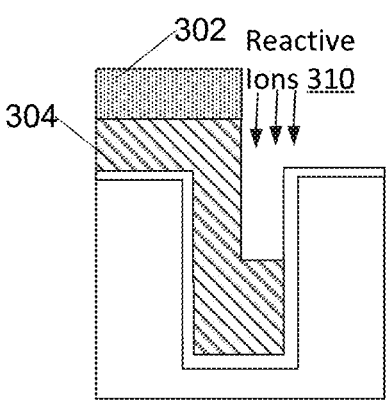
FIG. 3 is a cross-sectional diagram illustrating a reactive-ion etch step used in making the vertical transfer transistors of FIG. 2.

5. Masking and etching, using a reactive-ion etch (RIE), the polysilicon gate material 210 deposited in the respective deep trench define areas where the polysilicon gate material 210 emerges from the deep trench and areas that will form the vertical gate electrode of the transfer gate 208; during this step, a portion of the polysilicon gate material 210 in vertical gate area is etched back to below junctions of later formed floating diffusion region. As illustrated in FIG. 3, a developed photoresist layer 302 is formed over the polysilicon gate 304, then reactive ions 310 remove polysilicon gate material 210 from areas not covered by photoresist layer 302. These ions enter the deep trench and remove a desired amount of polysilicon gate material 210 from the deep trench—the etch can be controlled, such as by precisely timing the etch, to remove polysilicon to a desired depth in the trench without removing all polysilicon gate material 210 from the trench because unremoved polysilicon forms the vertical gate electrode for transfer gate 208; under or over etching the polysilicon may have detrimental effects on effective channel length and effective threshold voltage of the transfer gate 208.

The process described forms a transfer gate with a vertical transfer gate structure, however it is appreciated that in embodiments, the process can be applicable to transfer gate 208 with two, and in some embodiments more, vertical gate electrodes, for example, two deep trenches can be etched from the surface (e.g., front surface) of the semiconductor substrate 204 to the trench depth into the semiconductor substrate 204 with suitable spacing between the two deep trenches, follow by gate oxide and gate material deposition forming vertical gate electrodes adjacent to the respective photodiode diffusion region 202.

6. Ion-implanting source-drain regions of the reset transistor 206 and other transistors, including a drain 220 for the transfer gate 208, thereby simultaneously forming a drain 220 or floating diffusion region of the transfer gate 208—in an embodiment diffusion region 220 serves as both a drain region of the transfer gate 208 and as a source region of a reset transistor 206. The floating diffusion region 220 is a doped region of first conductive type formed at a junction depth with respect to the first surface, wherein the junction depth is less than the etched trench depth of the deep trench of vertical gate. In some embodiments, as illustrated in FIG. 2, the drain region or floating diffusion region 220 (FIG. 2) is coupled to another transfer gate 208 associated with a different photodiode in the same pixel cell to form a common drain region, or shared floating diffusion region 220, for receiving photogenerated charges from multiple photodiodes, this region may in some embodiments connect to reset and sense transistors through a contact or other circuitry as known in the art of array photosensors. In embodiments, the later-formed floating diffusion region 220 is arranged to surround vertical gate electrodes associated with transfer gates 208 coupled to the floating diffusion region 220.

7. Depositing spacer material into deep trench to form spacers 212 to vertical gates formed in deep trench. Each of the spacers 212 may include a single or multi-layer stack of dielectric material including silicon nitride, silicon oxide and combination thereof. In the illustrated embodiment, a top surface of spacer 212 is levelled with a top surface of the polysilicon gate electrode 211. However, in some embodiments, a top surface of spacer 212 may be slightly lower than a top surface of the polysilicon gate electrode 211.

Once the transfer gate are formed and processing completed, with appropriate biasing voltages applied on the respective polysilicon gate in the deep trench of selected transfer gates 208 and across gate oxide 209, a channel 216 forms along the vertical gate of the respect transfer gate 208, to couple respective photodiode 207 to floating diffusion region 220 for transferring photogenerated charge from photodiode 207 (source region of transfer transistor) to the floating diffusion region 220 (drain region of transfer transistor). Gate voltage applied to the transfer gate 208 thereby controls selection of the photodiodes 207.

In embodiments, transfer gate 208 may be referred to as vertical transfer gate (VTG). In embodiments, transfer gate 208 may act as a vertical selection transistor to selectively transfer photogenerated charges from associated buried photodiode 207 to floating diffusion region 220 through the channel 216 formed when transfer gate 208 receives an appropriate biasing voltage.

In an embodiment of the RIE embodiment, the deep trench, and gate oxide lined trench sidewall, extend from the buried photodiode to floating diffusion region 220, so that extension of the polysilicon gate material (e.g., planar gate) on the silicon surface from the deep trench to the drain region or floating diffusion region is not necessary. In such manner, parasitic capacitance between transfer gates 208 and floating diffusion region 220 is reduced to increase conversion gain.

Fabrication of the device illustrated in FIGS. 2 and 3 can be difficult because performance of the transfer gates 208 depends on the depth to which the respective polysilicon gate 211 is etched by the reactive ion etch relative to depth of the floating diffusion regions 220; variations in depth of the polysilicon gate cause variations in threshold of the transfer gates 208 and in turn-since variation is significant across individual image sensors on a wafer—are a source of effective noise in images recorded using such image sensors.

Figure 4A:
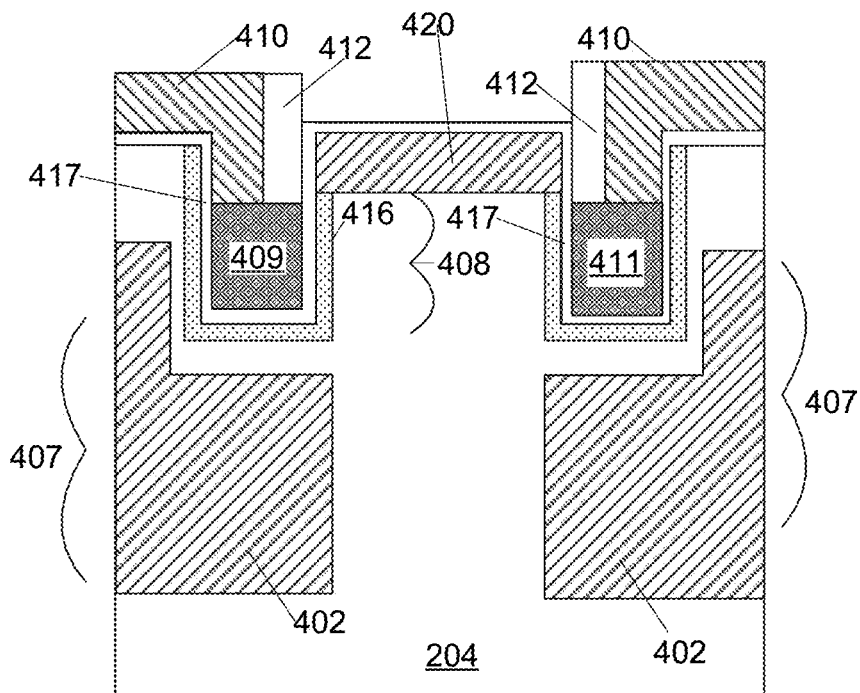
FIG. 4A is a cross-sectional diagram illustrating multiple vertical transfer-transistors for coupling multiple photodiodes to a common drain region.
Figure 4B:
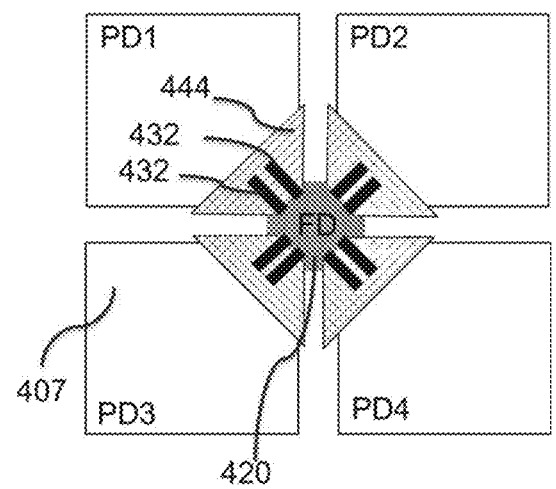
FIG. 4B is an exemplary layout showing four photodiodes with vertical transfer transistors merged to share a single merged source region.
Figure 5:
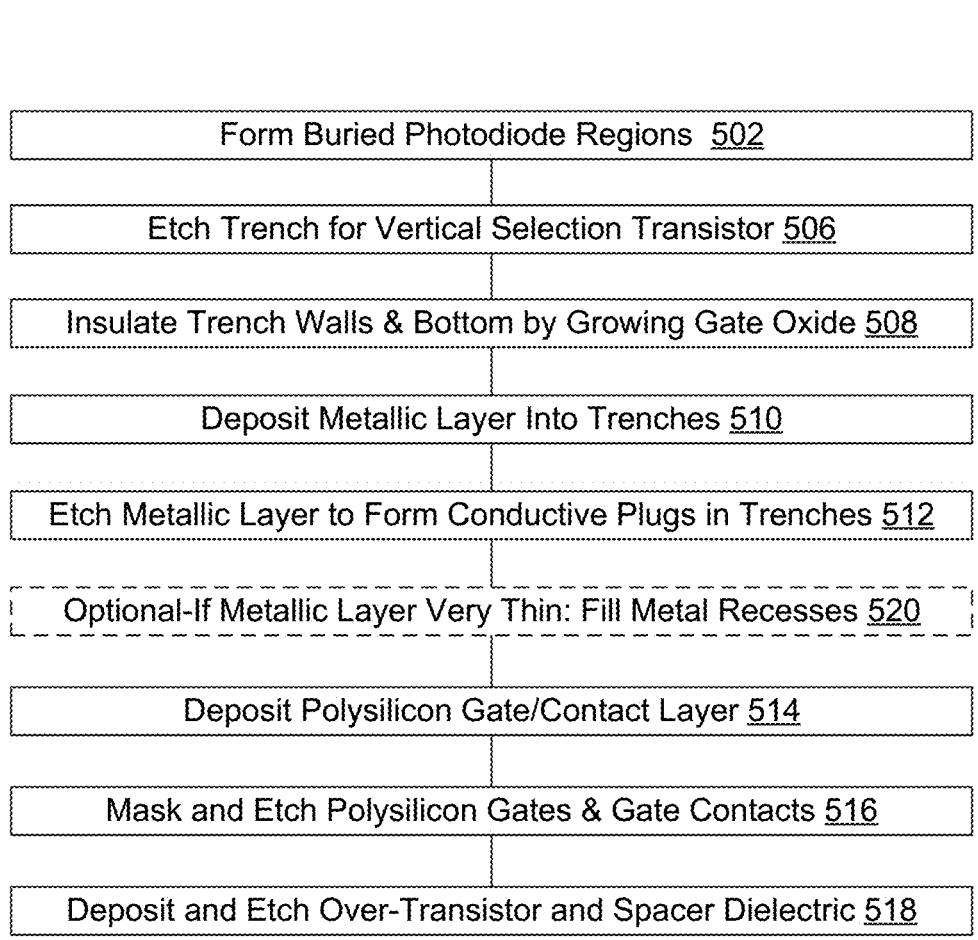
FIG. 5 is a flowchart illustrating key steps in fabricating the photodiode array with buried photodiodes and vertical transfer transistors.

A metal-plug embodiment of the photodiode array has cells in form of a four shared-pixel cell with photodiodes 407 coupled to vertical transfer gates having vertical gate structures and a common floating diffusion in each four shared-pixel cell as illustrated in FIGS. 4A and 4B. In this embodiment, after growing a gate oxide 417 in the deep trenches used to form vertical transfer gate, and before depositing the polysilicon gate material, a conductive metallic layer, which in some embodiments is selected from tungsten, titanium nitride, titanium carbide, or aluminum, and in other embodiments is another metal or metal alloy with a slower reactive-ion etch rate than polysilicon gate material, is deposited into the deep trenches. This conductive metallic layer is then etched back to remove all but metallic plugs 409, 411 in deep portions of the deep trenches for vertical gates of the transfer gates 408. Each of the metallic plugs 409, 411 is formed to extend from the bottom of the respect deep trench (e.g., deep portion) to at least the junction depth of the floating diffusion region 420. Each metallic plug 409, 411 is conformally formed in the respective deep trench for the vertical gate. When the polysilicon gate material is deposited directly over the metallic plugs 409, 411, and etched, it forms polysilicon gate electrodes 410 in the deep trenches that connect to the associated metallic plugs 409, 411. The polysilicon gate material is etched with a reactive ion etch as with the RIE embodiment, but the etch stops on reaching the respective metallic plugs 409, 411 because the etch attacks metal of the metallic plugs 409, 411 more slowly than the etch attacks polysilicon.

The gate electrode of each transfer gate 408 in the illustrated four-shared pixel cell is formed of at least two types of conductive materials. The gate electrode of each transfer gate 408 includes one or more vertical transfer gate portions (e.g., vertical gate electrode 432) and a planar transfer gate portion (e.g., planar gate electrode 444), wherein the one or more vertical transfer gate portions electrode 432) extended from planar transfer gate portion (e.g., planar gate electrode 444) into semiconductor substrate 204. In the illustrated embodiment, each of the vertical transfer gate portions 432 includes the metal plug 409 or 411 formed of metallic material (first conductive material) and the vertical portion of the polysilicon gate electrode 410 formed of the polysilicon gate material (second conductive material). The planar transfer gate portion 444 is the planar portion of the polysilicon gate electrode 410 formed of polysilicon gate material on the surface of semiconductor substrate 204.

The planar transfer gate portion 444 is extended on the semiconductor surface above the respective photodiode 402 and an edge of planar gate portion toward floating diffusion region 420 lies inside the deep trench, i.e., no part of planar transfer gate portion 444 formed on the floating diffusion region 420. In some embodiments, vertical transfer gate portions 444 of each respective transfer gate 408 extend toward floating diffusion region 420 and are surrounded by floating diffusion region 420 for at least three sides. In embodiments, each vertical transfer gate portion is parallel to another adjacent vertical transfer gate portion and is electrically coupled to the respective planar transfer gate portion of the transfer gate 408. Transfer gate 408 with its vertical gate surrounded by floating diffusion region 420 can lower potential barriers associated with transfer gate 408 to increase charge transfer efficiency improving image readout lag.

In an embodiment, a spacer 412 is disposed adjacent to floating diffusion region 420 in the portion of the deep trench that lies between the polysilicon gate electrodes and floating diffusion region 420. The spacer 412 has a first portion formed above semiconductor substrate 204 and a second portion formed in the deep trench formed in the semiconductor substrate 214. The spacer 412 abuts the polysilicon gate electrode 410 is and formed directly above the metal plug 409. In an embodiment, the top surface of spacer 412 is leveled with the polysilicon gate electrode 410. In another embodiment, the top surface of spacer 412 may be lower than the top surface of the polysilicon gate electrode 410. The spacer 412 may include material such as silicon oxide, silicon nitride or another dielectric. The thickness of spacer 412 may be defined based on the gap between the vertical portion of the polysilicon gate electrode 410 and the gate oxide 417 lining sidewalls of deep trench.

Since etch of the conductive metallic layer is slower, and easier to control, than the reactive-ion etch of polysilicon discussed with reference to the RIE embodiment of FIG. 3, effective channel length of the vertical transfer transistor 408 is easier to control than with the devices of FIG. 2. Once again, an appropriate voltage on the polysilicon gate electrode 410 across gate oxide 417 causes the polysilicon and metal composite gate electrode of transfer gate 408 to form a conduction channel coupling the buried diffused region 402 of photodiode 407 to the shared floating diffusion region 420.

The metallic plugs 409, 411 do not rise above tops of the respective deep trenches.

Components of the improved photodiode array resembling corresponding components of the photodiode array of FIG. 2 have like reference numbers and are not re-named here.

In the metallic plug embodiment of FIG. 4A, the photodiodes and vertical transfer gates are formed by a method 500 (FIG. 5), in approximate order although there are minor intervening steps and with reference to FIGS. 4A, 5, and 7A-7F:

1. Forming photodiodes 407 by forming 502, a photodiode diffusion region 402 of a first conductive type by a method such as masked diffusion or ion implantation into a semiconductor substrate 204 or well of a second conductive type opposite to the first conductive type. In some embodiments, the layer may be buried by an after-formed epitaxial layer and in other embodiments by a lower-energy implant for inverting surface semiconductor over the photodiode diffused regions. The photodiode diffusion region 402 is formed as a buried photodiode diffused region at a depth in the semiconductor substrate 204 from a first surface (e.g., front surface) of semiconductor substrate 204 with semiconductor material overlying photodiode diffusion region 402 and between the photodiode 407 and the first surface of semiconductor substrate 204. Optionally, an implant isolation well of the second conductive type can be further implanted into the semiconductor substrate 204 between photodiode diffused regions 402 of adjacent photodiodes to provide isolation therebetween.

2. Etching 506 deep trenches 431 (FIG. 7A) from the first surface (e.g., the front surface) of the semiconductor substrate 204 to near the buried photodiode diffusion regions 402 so the vertical transfer electrodes of the transfer gates can be formed in the respective deep trenches. Depending on transfer gate structures chosen, each transfer gate may have one, two, or more vertical transfer gate electrodes. The deep trenches extend from photodiode diffusion region 402 toward the floating diffusion region 420 and extend into the mask regions used to form the later-formed floating diffusion region 420. In embodiments, each of vertical transfer electrodes formed in the deep trenches is surrounded by the respective, later-formed, floating diffusion region 420 on at least three sides. In embodiments, deep trenches 431 are not in contact with respective photodiode diffusion regions 402.

3. A gate oxide 417 (FIG. 7B), such as silicon oxide, is deposited on sidewalls and bottom of the deep trenches, for example by growing 508 a thermal oxide. In alternative embodiments, gate oxide 417 is formed by oxide deposition.

4. Depositing 510 a metallic material (first conductive material) forming a conductive metallic layer 429 (FIG. 7B), which in some embodiments is selected from tungsten, titanium nitride, titanium carbide, or aluminum, and in other embodiments is another metal or metal alloy with a slower reactive-ion etch rate than polysilicon gate material, is deposited onto the semiconductor substrate 204 and penetrating the deep trenches.

5. Etching 512, typically with a reactive-ion etch, the conductive metallic layer to define a metallic plug 409 (FIG. 7C) in each respective deep trench by removing all the conductive metallic layer except the metallic plugs 409, 411 in each deep trench through a masking and etching process. The metallic plugs 409, 411 are adjacent the gate oxide 417 already formed in each deep trench.

6. Depositing 514 a layer 433 (FIG. 7D) of a polysilicon gate material such as an n-type doped polysilicon material into and above the deep trenches, and above the respective metallic plugs 409, 411 remaining in the deep trenches, the polysilicon gate material contacting the metallic plugs 409, 411. An annealing process may be applied after deposition of layer 433 to ensure good contact between metallic plugs 409, 411 and layer 433.

It should be noted that the metallic plugs and polysilicon gate material are different conductive materials. In an alternative embodiment, another conductive material is substituted for the polysilicon gate material.

7. Masking and etching 516, using a reactive-ion etch, the polysilicon gate material deep trench to define contact portions for polysilicon gate electrodes 410, surface polysilicon areas 435 (FIG. 7E) where the polysilicon emerges from the deep trenches, as well as forming gates of other transistors. Where metallic plugs 409, 411 exist, this etch stops upon reaching the metallic plugs because the metallic plug metal etches far slower than does polysilicon gate material. The polysilicon is typically cut back a distance to leave a narrow gap 437 from the later-formed floating-diffusion regions 420. Effective channel length in the transfer gate 408 with vertical transfer electrode is therefore controlled by thickness of the metallic plug material.

8. A dielectric material may then be deposited 518 over the masked and etched polysilicon gate/gate contact layer in deep trenches to form spacers 439 on the metallic plugs 409 and abutting the polysilicon gate electrodes. The floating diffusion regions 420 are implanted (FIG. 7F) into semiconductor substrate 204. In the illustrated embodiment, a top surface of spacer 439 is levelled with a top surface (e.g., surface polysilicon areas 435) of the polysilicon gate electrode 410. However, in some embodiments, a top surface of spacer 439 may be slightly lower than a top surface of the polysilicon gate electrode 410.

Additional implants, layers of dielectric, and conductor may then be formed to insulate sense/reset or floating diffusion region 420, form contact openings, to form overlying metal interconnect layers to contact, and thus couple power to, reset transistors and signals from sense transistors, and otherwise complete the photodiode array integrated circuit.

In embodiments, transfer gate 408 is referred to as vertical transfer gate (VTG). In embodiments, a transfer gate 408 with vertical gate structure coupling a photodiode diffusion region 402 of photodiode 407 to a floating diffusion region 420 form a vertical selection transistor that selectively transfers photogenerated charges from photodiode 407 to floating diffusion region 420 when transfer gate 408 receives a suitable biasing voltage. In one embodiment, a metal contact may be formed on the surface polysilicon areas 435 of polysilicon gate electrode 410 of respective transfer gates 408 connecting the transfer gate 408 to metal interconnection structure for applying a suitable biasing voltage (or control voltage) to the polysilicon gate electrodes 410 of the transfer gate 408. When a voltage is applied through polysilicon gate electrode 410 into metallic plug 409, channel 416 (FIG. 4A) develops in the transfer gate with vertical gate structure to couple the photodiode 402 to floating diffusion 420 and transfer photogenerated charges from photodiode 407 to floating diffusion region 420 with lower potential barrier between transfer gate and floating diffusion region 420, thereby improving charge transfer efficiency.

In some embodiments, the floating diffusion regions 420 (FIG. 4A) for of two or more vertical transfer gates (e.g., vertical transfer gate portion 432) associated with two or more photodiodes 407, 422 are merged; in a particular embodiment as illustrated in FIG. 4B vertical transfer gates with two vertical gate electrodes are couple each of four photodiodes 407 to a common floating diffusion region 420.

Figure 6:
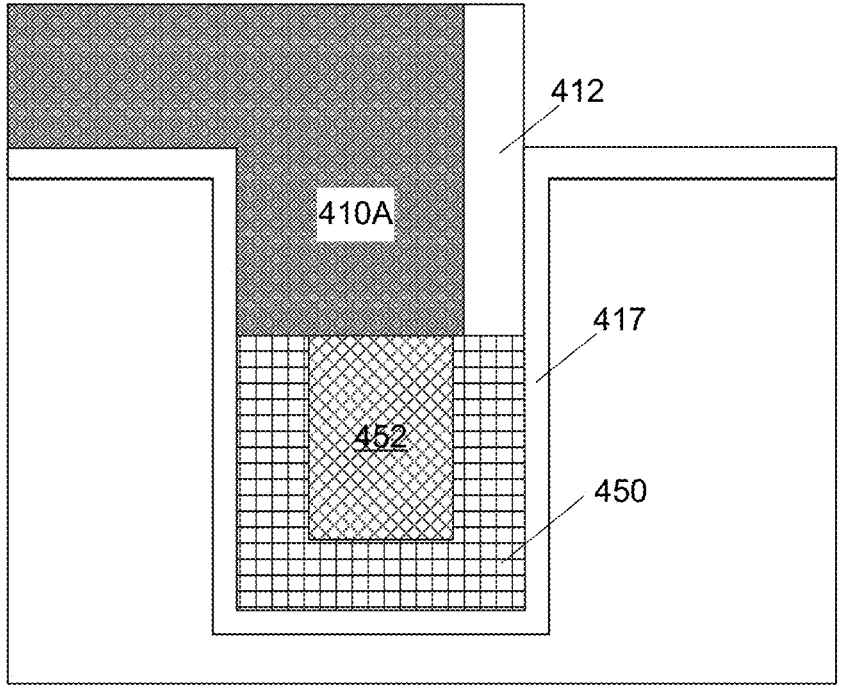
FIG. 6 is a cross-sectional diagram illustrating an alternative embodiment of the metallic plugs at trench bottoms where the metallic plugs are thin-walled and filled with metal.
Figure 7A:
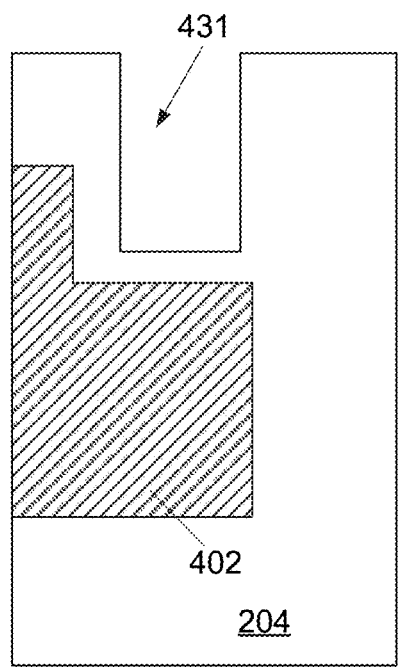
FIGS. 7A, 7B, 7C, 7D, 7E, and 7F are a sequence of cross-sectional diagrams illustrating the photodiode array being formed at various steps of the method of manufacture.
Figure 7B:
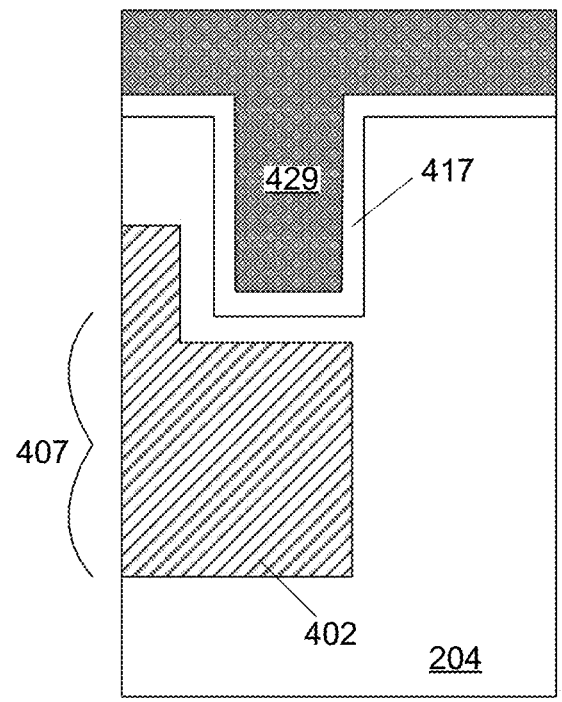
Figure 7C:
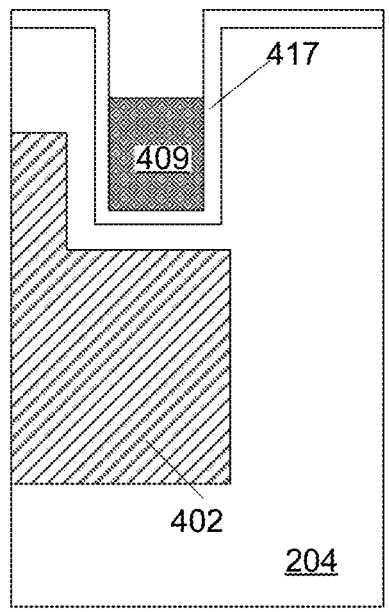
Figure 7D:
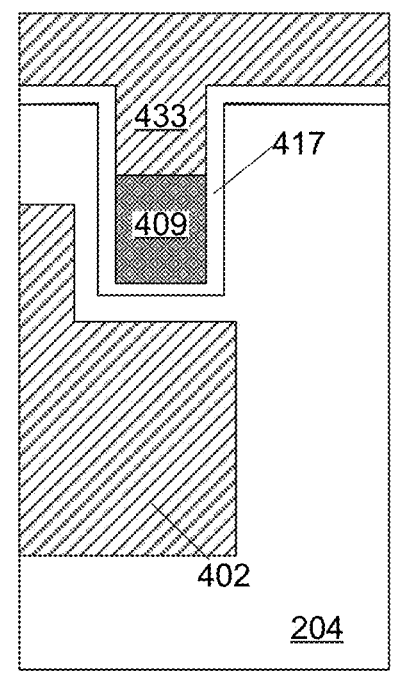
Figure 7E:
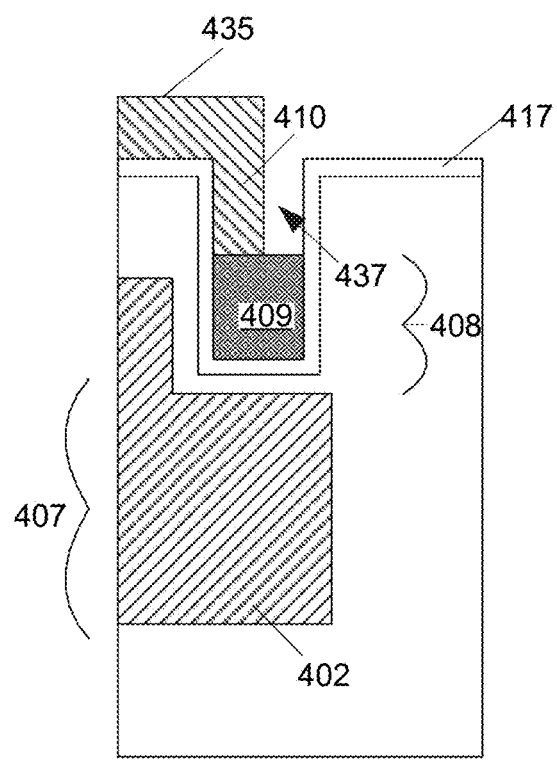
Figure 7F:
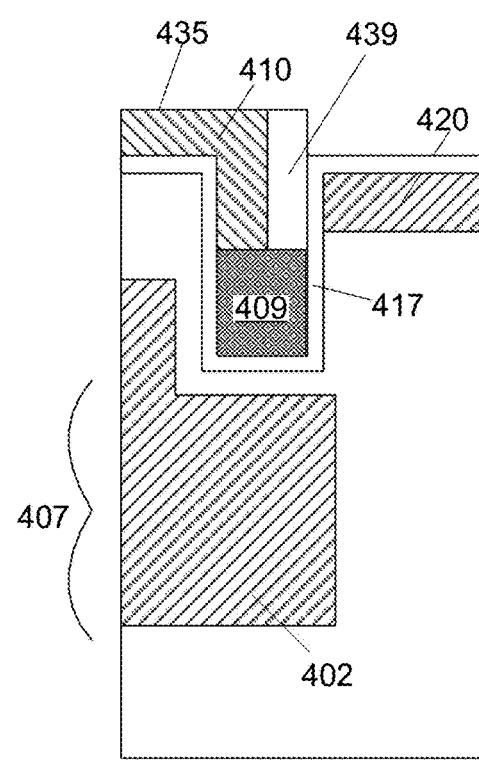

In some embodiments, where the metallic layer deposited over gate oxide 417 is very thin in the respective deep trench and resulting metallic plug 450 (FIG. 6). Metallic plug 450 is deposited by conformal chemical vapor deposition and are so thin-walled as to have a cavity 452 in the middle or center of each plug. Deposition of the polysilicon gate material fills in the openings 452 of metallic plugs 450 forming polysilicon contacts 410A (polysilicon gate electrodes) that extend into the metallic plug 450. The polysilicon contacts 410A further extend onto semiconductor substrate surface forming a planar transfer gate portion for transfer gate 408. The metallic plug 450 and the portion of polysilicon contacts 410A deposited in the deep trench and the opening 452 form the vertical transfer gate portion 432 of the transfer gate 408. The spacer 412 is formed in the deep trench on the metallic plug 450 and abuts the polysilicon contacts 410A.

In a particular embodiment (FIG. 4B) of both the RIE embodiment with the reactive ion etch and the metallic plug embodiment, pairs of vertical transfer gates associated with each of four photodiodes are configured such that each pair of vertical transfer gate electrodes 432 of vertical transfer gates couple to a common drain region (a shared floating diffusion region) 420 for all four pairs, while the polysilicon gate electrode 410, 432, 444, metal plugs 409, 411, and photodiodes 407, 422 remain separate for each pair. The common drain region is coupled to a common reset transistor (not shown) configured to reset the four photodiodes. In this embodiment, the trenches for the vertical transfer gates 432 extend all the way from the buried photodiodes into floating diffusion region 420, eliminating need for surface channels needed with the baseline embodiment. The deep trenches laterally extending from the buried photodiodes to the common drain region improves charge transfer efficiency over the baseline design, and having vertical transfer gate of each vertical transfer gate formed of two type of conductive material avoids need for overlap of polysilicon gate material beyond the trenches to the floating diffusion region providing better processing control.

Although the embodiments describe vertical gate structures for vertical transfer gate for a four-shared pixel case, i.e., a pixel cell with four photodiodes and four vertical transfer transistors that coupled each individual photodiode to a common floating diffusion region, it is appreciated that the described vertical transfer gate structures reaching the shared floating diffusion region and surrounded by shared floating diffusion region may also be applicable to single, two, six, or eight shared-pixel cells depending on the application of image sensor to increase charge transfer efficiency, without departing from the scope of the invention. A single pixel cell structure refers to a pixel cell having one photodiode and a floating diffusion region. A multi-shared pixel cell structure refers to cells having more than one photodiode diffusion. A four shared-pixel cell include four photodiodes and a shared floating diffusion region coupled to four photodiodes.

Combinations

The methods and principles described herein can be applied in various combinations. Among combinations anticipated by the inventors are:

A pixel cell designated D, including a plurality of photodiodes disposed in a semiconductor substrate; a floating diffusion region disposed in a semiconductor substrate; and a plurality of transfer gates each coupling a photodiode of the plurality of photodiodes to the floating diffusion region, wherein each transfer gate further includes a trench extended from a first surface of semiconductor substrate into the semiconductor substrate above the photodiode coupled to the respective transfer gate, the trench extended from the photodiode into, and surrounded by the floating diffusion region; and a vertical gate electrode disposed in the trench, the vertical gate electrode laterally extended into the floating diffusion region.

A pixel cell designated DA including the pixel cell designated D, wherein vertical gate electrode further include: a gate oxide lining sidewalls of the trenches; a first conductive portion formed of a first conductive material disposed in a bottom portion of the trench; a second conductive portion formed of a second conductive material, disposed in the trench and onto the conductive plug, the second electrode portion in contact with the conductive plug, the second electrode portion extended onto a first surface of semiconductor substrate, where the second conductive material differs from the first conductive material.

A pixel cell designated DB including the pixel cell designated D or DA where an edge of the second electrode portion lies inside the trench.

A pixel cell designated DC including the pixel cell designated D, DA, or DB further including: a spacer formed in the trench and on the conductive plug, a bottom of the spacer disposed between the edge of the second conductive portion and a wall of the trench.

A pixel cell designated DD including the pixel cell designated D, DA, DB, or DC wherein the second electrode portion is disposed with a gap formed in the trench between the second conductive portion and a sidewall of the trench adjacent to the floating diffusion region.

A pixel cell designated DE including the pixel cell designated DD, wherein a spacer is disposed in the gap.

A pixel cell designated DF including the pixel cell designated DA, DB, DC, DD, or DE, wherein the first conductive material and the second conductive material have different etch rates under reactive ion etch.

A pixel cell designated DG including the pixel cell designated DA, DB, DC, DD, DE, or DF wherein the first conductive material consists primarily tungsten, titanium nitride, titanium carbide, or aluminum.

A pixel cell designated DH including the pixel cell designated DA, DB, DC, DD, DE, DF, or DG wherein the second conductive material consists primarily of polysilicon.

A pixel cell designated DJ including the pixel cell designated DA, DB, DC, DD, DE, DF, DG, or DH wherein a portion of the photodiode is formed under the trench.

A photodiode array designated E having buried photodiodes and transfer transistors includes a plurality of buried photodiode diffused regions; a plurality of trenches formed over the buried photodiode diffusion regions; a gate oxide lining sidewalls of the trenches; metallic plugs formed of a first conductive material within the trenches adjacent the gate oxide; gate contacts formed of a second conductive material, the second conductive material different from the first conductive material, the gate contacts in contact with the metallic plugs; the trenches extending into and surrounded by the floating diffusion region; where the floating diffusion region form drains of transfer transistors, the metallic plugs form a vertical portion of gates of the transfer transistors, and buried photodiode diffusion regions form source of the transfer transistors.

A photodiode array designated EA including the photodiode array designated E wherein the first conductive material comprises tungsten, titanium nitride, titanium carbide, or aluminum.

A photodiode array designated EB including the photodiode array designated E or EA wherein the second conductive material comprises polysilicon.

A method of manufacture designated F of a photodiode array having buried photodiodes and vertical selection transistors includes forming a plurality of buried photodiode diffusion regions in a silicon wafer; etching a plurality of deep trenches from a surface of the silicon wafer to near the plurality of photodiode diffusion regions; forming a gate oxide on sidewalls of the deep trenches; depositing a conductive metallic layer into the deep trenches; etching the conductive metallic layer to define metallic plugs in deep portions of the deep trenches; depositing a conductive gate-contact material into and above the deep trenches and contacting the metallic plugs in the deep trenches; masking and etching the conductive gate-contact material; and forming a floating diffusion region surrounding each deep trench of the deep trenches. In this method, the conductive gate-contact material, which in many embodiments is polysilicon, and metal plugs in the deep trenches form gates of a plurality of vertical selection transistors, each vertical selection transistor having a drain diffusion formed of the drain diffusion regions and a source of the photodiode diffused regions. In most embodiments, the drain surrounds the deep trenches associated with the respective vertical selection transistor.

A method designated FA including the method designated F wherein the conductive metallic layer comprises tungsten, titanium nitride, titanium carbide, or aluminum A method designated FB including the method designated F or FA including depositing another metallic layer to fill the metallic plugs.

A method designated FC including the method designated FA, FB, or FC wherein the etching of the conductive gate-contact material is performed by a reactive ion etch that stops upon reaching the metallic plugs.

A photodiode array designated G having buried photodiodes and vertical selection transistors includes a plurality of buried photodiode diffused regions; a plurality of trenches formed in an epitaxial layer over the buried photodiode diffused regions; gate oxide lining sidewalls of the trenches; conductive gate material disposed within the trenches such that the gate material is wider at a base of each trench than at a top of each trench; implanting drain regions, selected drain regions forming floating nodes extending to each deep trench of the deep trenches; wherein the conductive metallic plugs form gates of vertical transistors, each vertical transistor having a drain in the selected implanted source-drain regions and a source of the respective photodiode diffused region of photodiode diffused regions.

A photodiode array designated GA including the photodiode array designated G wherein the conductive gate material consists primarily of polysilicon.

A method of manufacture designated H of forming an array photosensor comprising a photodiode array with buried photodiodes includes forming buried photodiode diffused regions in a silicon wafer; etching deep trenches from a surface of the silicon wafer to near the photodiode diffused regions; growing a gate oxide on sidewalls of the deep trench; depositing polysilicon into the trenches; etching the polysilicon using a reactive ion etch to narrow polysilicon at tops of the trenches, while avoiding etching polysilicon at bottoms of the trenches, such that the polysilicon in the trenches is narrower at the top than at the bottom of the trenches; and implanting drain regions; wherein the polysilicon in the trenches forms gates of vertical transistors, each vertical transistor having a drain formed of the implanted drain regions and a source of the respective photodiode diffused regions of the photodiode diffused regions.

A photodiode array designated A having buried photodiodes and vertical selection transistors including a plurality of buried photodiode diffused regions with a plurality of trenches formed in an epitaxial layer over the buried photodiode diffused regions, the trenches having bottoms near the photodiode diffused regions. The trenches have gate oxide lining their sidewalls, and metallic plugs formed of a first conductive material within the trenches adjacent the gate oxide. Gate contacts are formed of a second conductive material, the second conductive material different from the first conductive material, the gate contacts in contact with the metallic plugs, and implanted drain diffusion regions are adjacent the respective trenches. The implanted drain diffusion region form drains of vertical selection transistors, the metallic plugs form gates of the vertical selection transistors, and buried photodiode diffused regions form sources of the vertical selection transistors.

A photodiode array designated AA including the photodiode array designated A where the first conductive material is formed of tungsten, titanium nitride, titanium carbide, or aluminum.

A photodiode array designated AB including the photodiode array designated A or AA wherein the second conductive material is formed of polysilicon.

A method of manufacture designated B of a photodiode array having buried photodiodes and vertical selection transistors includes forming photodiode diffused regions; growing an epitaxial layer over the photodiode diffused regions; etching deep trenches from surface of the epitaxial layer to near the photodiode diffused regions; growing a gate oxide on sidewalls of the deep trenches; and depositing a conductive metallic layer with a slower reactive-ion etch rate than a conductive gate-contact material into the trenches. The method also includes etching the conductive metallic layer to define metallic plugs in deep portions of the trenches; depositing the conductive gate-contact material into and above the deep trenches and in contact with the metallic plugs in the trenches; masking and etching the conductive gate-contact material; and forming floating diffusion regions. The conductive metallic plugs form gates of vertical transistors, each vertical transistor having a drain formed of the floating diffusion region coupled and a source of the photodiode diffused regions.

A method designated BA including the method designated B wherein the conductive metallic layer comprises tungsten, titanium nitride, titanium carbide, or aluminum A method designated BB including the method designated BA or B further including depositing another metallic layer to fill the metallic plugs.

A method designated BC including the method designated B, BA, or BB wherein the etching of the gate-contact material is performed by a reactive ion etch that stops upon reaching the metallic plugs.

A photodiode array designated C having buried photodiodes and vertical selection transistors including a plurality of buried photodiode diffused regions; a plurality of trenches formed in an epitaxial layer over the buried photodiode diffused regions; gate oxide lining sidewalls of the trenches; conductive gate material disposed within the trenches such that the gate material is wider at a base of each trench than at a top of each trench; and forming floating diffusion regions adjacent the trenches; where each of floating diffusion regions form a drain of vertical selection transistors coupled, the metallic plugs form gates of the vertical selection transistors, and buried photodiode diffused regions form sources of the vertical selection transistors.

A photodiode array designated CA including the photodiode array designated C wherein the conductive gate material consists primarily of polysilicon.

A method of manufacture designated D of an array photosensor comprising a photodiode array with buried photodiodes including forming buried photodiode diffused regions in a silicon wafer; etching deep trenches from a surface of the silicon wafer to near the photodiode diffused regions; growing a gate oxide on sidewalls of the deep trench; depositing polysilicon into the trenches; etching the polysilicon using a reactive ion etch to narrow polysilicon at tops of the trenches, while avoiding etching polysilicon at bottoms of the trenches, such that the polysilicon in the trenches is narrower at the top than at the bottom of the trenches; and form a floating diffusion regions; wherein the polysilicon in the trenches forms gates of vertical transistors, each vertical transistor coupled to in one of floating diffusion regions and one or more photodiode diffused regions.

While the invention has been particularly shown and described with reference to a preferred embodiment thereof, it will be understood by those skilled in the art that various other changes in the form and details may be made without departing from the spirit and scope of the invention. It is to be understood that various changes may be made in adapting the invention to different embodiments without departing from the broader inventive concepts disclosed herein and comprehended by the claims that follow.

What is claimed is:

1. A pixel cell, comprising:
   a plurality of photodiodes disposed in a semiconductor substrate;
   a floating diffusion region disposed in a semiconductor substrate; and
   a plurality of transfer gates each coupling a photodiode of the plurality of photodiodes to the floating diffusion region, wherein each transfer gate further comprising:
   a trench extended from a first surface of semiconductor substrate into the semiconductor substrate adjacent to the photodiode coupled to the respective transfer gate, the trench extended from the photodiode into by the floating diffusion region; and
   a vertical gate electrode disposed in the trench, the vertical gate electrode laterally extended into the floating diffusion region;
   wherein the vertical gate electrodes further comprise:
   a gate oxide lining sidewalls of the trenches;
   a first conductive portion formed of a first conductive material disposed in a bottom portion of the trench;
   a second conductive portion formed of a second conductive material, disposed in the trench and onto the first conductive portion, the second conductive portion in contact with the first conductive portion, the second conductive portion extended onto a first surface of semiconductor substrate, wherein the second conductive material is different from the first conductive material.

2. The pixel cell of claim 1, wherein an edge of the second conductive portion lies inside the trench.

3. The pixel cell of claim 2, further comprising:
   a spacer formed in the trench and on the first conductive portion, a bottom of the spacer disposed between the edge of the second conductive portion and a wall of the trench.

4. The pixel cell of claim 2, wherein the second conductive portion is disposed with a gap formed in the trench between the second conductive portion and a sidewall of the trench adjacent to the floating diffusion region.

5. The pixel cell of claim 4, wherein a spacer is disposed in the gap.

6. The pixel cell of claim 1 wherein the first conductive material and the second conductive material have different etch rates under reactive ion etch.

7. The pixel cell of claim 1 wherein the first conductive material comprises tungsten, titanium nitride, titanium carbide, or aluminum.

8. The pixel cell of claim 1, wherein the second conductive material comprises polysilicon.

9. The pixel cell of claim 1, wherein a portion of the photodiode is formed under the trench.

10. A pixel cell, comprising:
    a plurality of buried photodiode diffusion regions disposed in a semiconductor substrate;

a plurality of transfer gates coupled to buried photodiode diffusion regions, each transfer gate comprising:
  two trenches extended into semiconductor substrate and over each of the buried photodiode diffusion regions;
  a gate oxide lining sidewalls of the trenches;
  a conductive gate material disposed within each of the trenches such that the conductive gate material is wider at a base of each trench than at a top of the respective trench, the conductive material forming vertical gate electrodes for the transfer gate; and
a floating diffusion region coupled to the plurality of transfer gates;
wherein the plurality of transfer gates are coupled to transfer charges from respective buried photodiodes to the floating diffusion region.

11. The pixel cell of claim 10 wherein the conductive gate material comprises a polysilicon material and a metallic material.

12. The pixel cell of claim 10, wherein the conductive gate material extends onto a surface of the semiconductor substrate forming a planar gate electrode portion of the respective transfer gate.

13. A photodiode array including a plurality of pixel cells, each pixel cells having buried photodiodes and transfer transistors comprising:
  a plurality of buried photodiode diffused regions disposed in a semiconductor substrate;
  a floating diffusion region disposed in the semiconductor substrate;
  a plurality of trenches disposed in the semiconductor substrate over the buried photodiode diffusion regions, the plurality of trenches extending into the floating diffusion region;
  a gate oxide lining sidewalls of the plurality of trenches;
  a plurality of metallic plugs formed of a first conductive material within the plurality of trenches adjacent the gate oxide; and
  a plurality of gate contacts formed of a second conductive material, the second conductive material different from the first conductive material, each gate contact in contact with the respective metallic plug;
  wherein the floating diffusion region form a drain of transfer transistors, each of the metallic plugs form a vertical portion of a gate of the respective transfer transistor of the transfer transistors, and buried photodiode diffusion regions form sources of the transfer transistors.

14. The photodiode array of claim 13 wherein the first conductive material comprises tungsten, titanium nitride, titanium carbide, or aluminum.

15. The photodiode array of claim 14 wherein the second conductive material comprises polysilicon, where each gate contacts further forms a planar portion of the gate of the respective transfer transistor.

\* \* \* \* \*